(12) United States Patent
Doluca et al.

(10) Patent No.: US 11,170,844 B1
(45) Date of Patent: Nov. 9, 2021

(54) ULTRA-LOW SUPPLY-VOLTAGE STATIC RANDOM-ACCESS MEMORY (SRAM) WITH 8-TRANSISTOR CELL WITH P AND N PASS GATES TO SAME BIT LINES

(71) Applicant: Aril Computer Corporation, Los Altos, CA (US)

(72) Inventors: Sinan Doluca, Saratoga, CA (US); Thomas J. Riordan, Los Altos, CA (US)

(73) Assignee: Aril Computer Corporation, Los Altos, CA (US)

( * ) Notice: Subject to any disclaimer, the term of this patent is extended or adjusted under 35 U.S.C. 154(b) by 0 days.

(21) Appl. No.: 16/922,087

(22) Filed: Jul. 7, 2020

(51) Int. Cl.
| | | |
|---|---|---|
| *G11C 11/41* | (2006.01) | |
| *G11C 11/412* | (2006.01) | |
| *H01L 27/11* | (2006.01) | |
| *G11C 11/419* | (2006.01) | |

(52) U.S. Cl.
CPC .......... *G11C 11/412* (2013.01); *G11C 11/419* (2013.01); *H01L 27/1104* (2013.01); *H01L 27/1116* (2013.01); *G11C 11/41* (2013.01)

(58) Field of Classification Search
None
See application file for complete search history.

(56) References Cited

U.S. PATENT DOCUMENTS

| | | | |
|---|---|---|---|
| 4,110,841 A * | 8/1978 | Schroeder | G11C 11/4091 326/62 |
| 5,126,970 A * | 6/1992 | Ul Haq | G11C 11/419 365/154 |
| 6,137,715 A * | 10/2000 | Cho | G11C 11/419 365/156 |
| 6,529,421 B1 | 3/2003 | Marr et al. | |
| 6,775,181 B2 | 8/2004 | Zhang et al. | |
| 7,397,693 B2 | 7/2008 | Yamaoka et al. | |
| 7,489,540 B2 * | 2/2009 | Ramaraju | G11C 7/1045 365/154 |
| 7,564,725 B2 | 7/2009 | Houston | |
| 7,869,261 B2 | 1/2011 | Ozawa | |

(Continued)

FOREIGN PATENT DOCUMENTS

| | | |
|---|---|---|
| CN | 103165177 B | 4/2016 |
| EP | 2973578 B1 | 10/2016 |

*Primary Examiner* — Tan T. Nguyen
(74) *Attorney, Agent, or Firm* — Stuart T. Auvinen; gPatent LLC

(57) ABSTRACT

An eight-transistor (8T) Static Random-Access Memory (SRAM) cell has four latch transistors, and pairs of n-channel and p-channel pass transistors in parallel to only one pair of bit lines. During read, only the read word line and the n-channel pass transistors are activated, but during a write both the read word line and an extra write word line are activated to turn on all four pass transistors. The cell is powered by VDDM, one threshold above the normal VDD power supply of the read sense and write drivers and interfaces. The bit lines are precharged to VDD but pulled up to VDDM by a latch of cross-coupled p-channel transistors. Any p-channel transistors that connect to the bit lines are driven inactive by VDDM. The read margin is largely decoupled from the write margin by two additional p-channel pass transistors and one extra word line versus a standard 6T cell.

17 Claims, 6 Drawing Sheets

(56) References Cited

U.S. PATENT DOCUMENTS

| | | | |
|---|---|---|---|
| 8,599,604 B2* | 12/2013 | Takemura | G11C 11/412 365/154 |
| 8,625,334 B2 | 1/2014 | Liaw | |
| 9,142,284 B2 | 9/2015 | Lee et al. | |
| 9,401,366 B1 | 7/2016 | Lu et al. | |
| 9,460,776 B2 | 10/2016 | Dally | |
| 2005/0207210 A1* | 9/2005 | Barth, Jr. | G11C 11/412 365/154 |
| 2007/0058419 A1* | 3/2007 | Khellah | G11C 11/412 365/154 |
| 2007/0139996 A1* | 6/2007 | Ozawa | G11C 11/412 365/154 |
| 2007/0268740 A1* | 11/2007 | Aly | G11C 11/412 365/154 |
| 2008/0117665 A1* | 5/2008 | Abeln | G11C 8/16 365/154 |
| 2008/0273382 A1* | 11/2008 | Wang | H01L 27/11 365/181 |
| 2011/0305072 A1* | 12/2011 | Ishii | G11C 7/12 365/154 |
| 2012/0243287 A1 | 9/2012 | Kawasumi | |
| 2013/0154027 A1* | 6/2013 | Liaw | G11C 11/412 257/390 |
| 2013/0182494 A1* | 7/2013 | Badrudduza | G11C 8/16 365/156 |
| 2015/0348598 A1* | 12/2015 | Wang | G11C 11/419 365/72 |
| 2015/0371708 A1* | 12/2015 | Pickering | G11C 11/404 711/105 |
| 2017/0229166 A1 | 8/2017 | Wang et al. | |
| 2019/0006372 A1* | 1/2019 | Lu | H01L 21/823842 |
| 2019/0305971 A1* | 10/2019 | Li | G11C 7/12 |
| 2020/0135268 A1* | 4/2020 | Fujiwara | H01L 27/1104 |

* cited by examiner

ULTRA-LOW SUPPLY-VOLTAGE STATIC RANDOM-ACCESS MEMORY (SRAM) WITH 8-TRANSISTOR CELL WITH P AND N PASS GATES TO SAME BIT LINES

FIELD OF THE INVENTION

This invention relates to Static Random-Access Memory (SRAM), and more particularly to an SRAM with an eight-transistor (8T) SRAM cell.

BACKGROUND OF THE INVENTION

Semiconductor memories such as Static Random-Access Memory (SRAM) have employed scaling of their supply voltages as the cell transistors shrink in size due to advances in semiconductor processing technologies. Performance and clock frequency can be traded off against power consumption and heating. Voltage scaling and frequency scaling can be performed dynamically during operation as well as statically during device design.

A traditional SRAM cell has four transistors that form a latch that stores a bit of data, and two pass transistors that connect the latch to a pair of bit lines. Both reading and writing of the cell are performed through these pass transistors in the traditional 6T SRAM cell.

It has been difficult to scale the supply voltage to the traditional 6T SRAM cell for newer technologies, such as Fin Field-Effect Transistor (FinFET) Complementary Metal-Oxide-Semiconductor (CMOS) processes. These scaling problems can occur due to read signal margin and write signal margin requirements. To improve these margin requirements, some semiconductor foundries require a higher memory supply voltage (VDDM) to SRAM building blocks than the supply voltage to other logic (VDD).

Various SRAM cells have been created to improve margins. An extra bit line or two can be added for use during read operations so that read and write use separate bit lines. However, the extra bit lines and read transistors increase the cell size and complexity.

What is desired is a SRAM cell with only 2 bit lines, but with better margins than a traditional 6T cell. It is desired to add transistors to the SRAM cell to provide separate read and write access to the memory cell, while sharing the bit lines for both read and write. It is desired to add only two transistors and one word line to the traditional 6T SRAM cell to provide for better control of read and write signal margins. It is desired to further improve margins by using an elevated supply voltage to the cell and to write circuitry but not to read circuitry.

DETAILED DESCRIPTION

The present invention relates to an improvement in SRAM. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
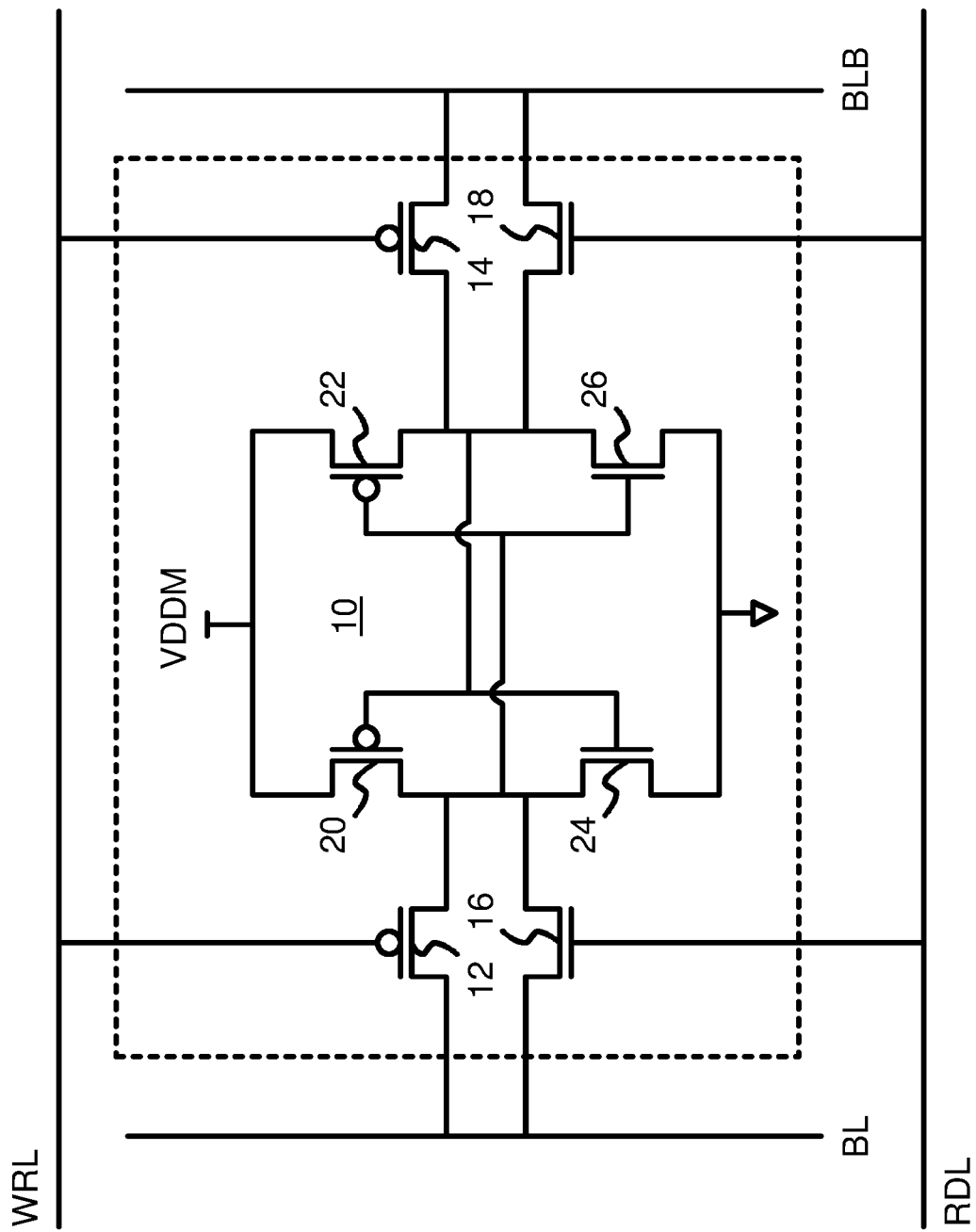
FIG. 1 is a diagram of an 8T SRAM cell with P and N transistors to a single pair of bit lines that are shared for read and write.

FIG. 1 is a diagram of an 8T SRAM cell with P and N transistors to a single pair of bit lines that are shared for read and write. Cell 10 stores one bit of data in a latch created by p-channel transistors 20, 22 and n-channel transistors 24 26. The drains of p-channel transistor 20 and n-channel transistor 24 are connected together and to the gates of p-channel transistor 22 and n-channel transistor 26, which have their drains connected together and to the gates of p-channel transistor 20 and n-channel transistor 24, forming a pair of cross-coupled inverters. The sources of n-channel transistors 24, 26 connect to ground, while the sources of p-channel transistors 20, 22 connect to the memory power supply VDDM, which can be one n-channel transistor-threshold above the normal power supply VDD, or about VDD+125 mV. A charge pump (not shown) can generate VDDM.

As with a traditional 6T SRAM cell, only a single pair of bit lines BL, BLB, connect to cell 10. However, separate pass transistors are provided for read and for write operations. N-channel pass transistors 16, 18 are used for reads, while p-channel pass transistors 12, 14 are used for writes. An additional row line or word line is added to separately control the read and write pass transistors. Read word line RDL drives the gates of n-channel pass transistors 16, 18 high during a read, allowing the drains of transistors 20, 24 to drive bit line BL through n-channel pass transistor 16, and allowing the drains of transistors 22, 26 to drive complementary bit line BLB through n-channel pass transistor 18.

During a write operation, write word line WRL drives the gates of p-channel pass transistors 12, 14 low, allowing bit line BL to drive the drains of transistors 20, 24 through p-channel pass transistor 12, and allowing complementary bit line BLB to drive the drains of transistors 22, 26 through p-channel pass transistor 14, thus writing data into cell 10.

To improve the write margin, both P and N pass transistors are turned on for a write, so that p-channel pass transistor 12 and n-channel pass transistor 16 act as a transmission gate between the cell latch and bit line BL. Likewise, p-channel pass transistor 14 and n-channel pass transistor 18 act as a transmission gate to BLB.

During a write, write word line WRL is activated by driving it low, and read word line RDL is also activated by driving it high, so that all pass transistors 12, 14, 16, 18 are turned on.

During a read, write word line WRL is de-activated by driving it high, while read word line RDL is activated by driving it high, so that only n-channel pass transistors 16, 18 are turned on. P-channel pass transistors 12, 14 are turned off during a read operation.

Compared with a traditional 6T SRAM cell, 8T cell 10 has two additional p-channel pass transistors 12, 14. One additional word line, write word line WRL, is also added. The cell is symmetric and does not require dummy transistors.

Since hole mobility is lower than electron mobility, p-channel pass transistors 12, 14 are not as efficient as n-channel pass transistors 16, 18. P-channel transistors require a large channel width for a given current drive. Overall, 8T cell 10 can be approximately 50% larger in size when compared with a traditional 6T SRAM cell, depending on the layout.

Figure 2:
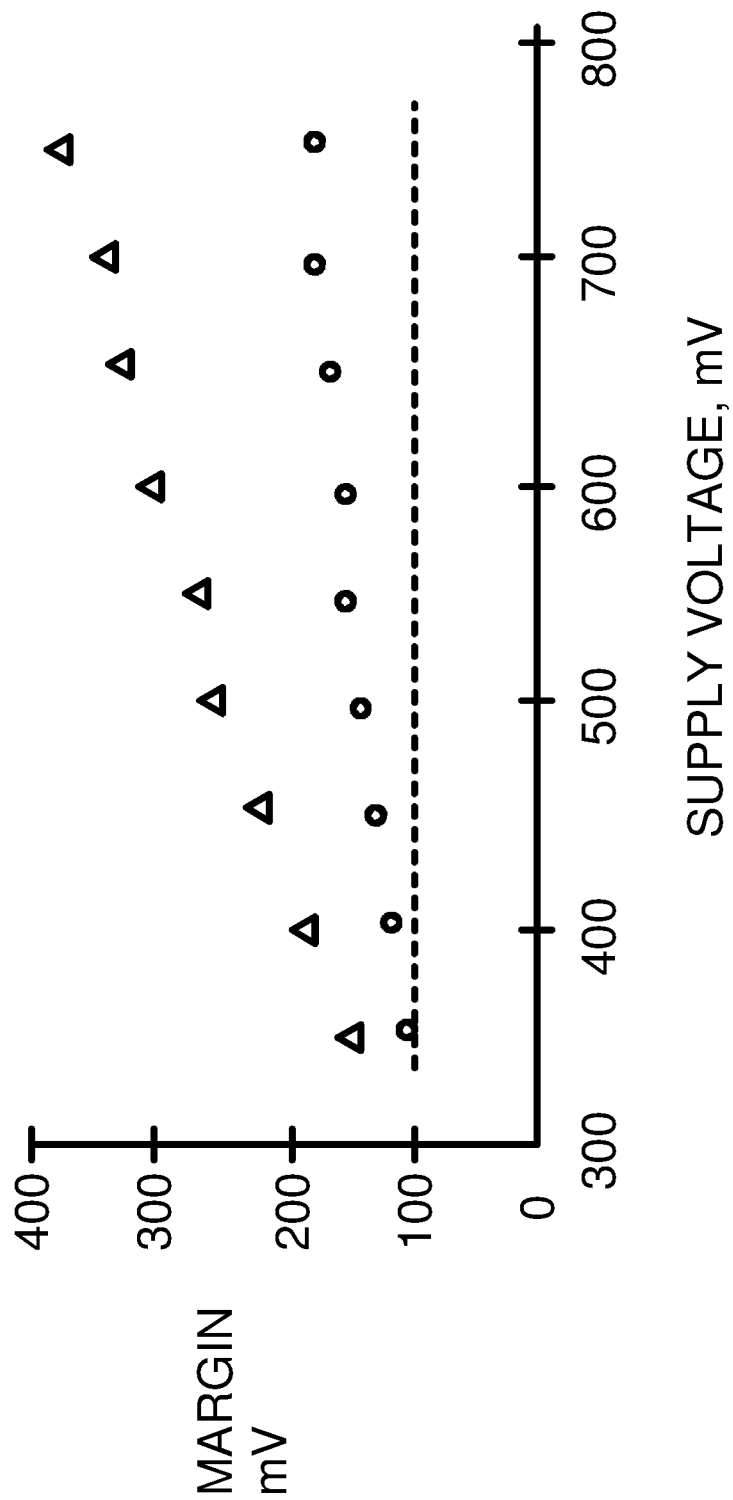
FIG. 2 is a graph of signal margin as a function of supply voltage for read and write of the 8T SRAM cell.

FIG. 2 is a graph of signal margin as a function of supply voltage for read and write of the 8T SRAM cell. The read margin of the 8T SRAM cell of FIG. 1 is largely decoupled from the write margin by the additional p-channel pass transistors in parallel with the n-channel pass transistors.

The margin improves for higher supply voltages (VDD), for both writes (triangles) and reads (circles). The memory supply, VDDM, is set to VDD+125 mV. The signal margins are generated using a Monte Carlo simulation over conditions from −40 C to +125 C, typical process.

When the cell requirement is for 100 mV of signal margin, as shown by the dashed line in FIG. 2, then VDD as low as 350 mV can meet the margin requirement for both reads and writes.

The write margin is higher than the read margin for all values of supply voltage VDD, since writing into the cell is performed through parallel n-channel and p-channel pass transistors, while reading from the cell is performed using only the n-channel transistors.

Adding the pull-up latch to VDDM of cross-coupled latch p-channel transistors 36, 38 (FIG. 3) improves the write margin by 20+mV beyond what is shown in this graph. The pull-up latch to VDDM also significantly speeds up write operation for ultra-low supply operation.

Figure 3:
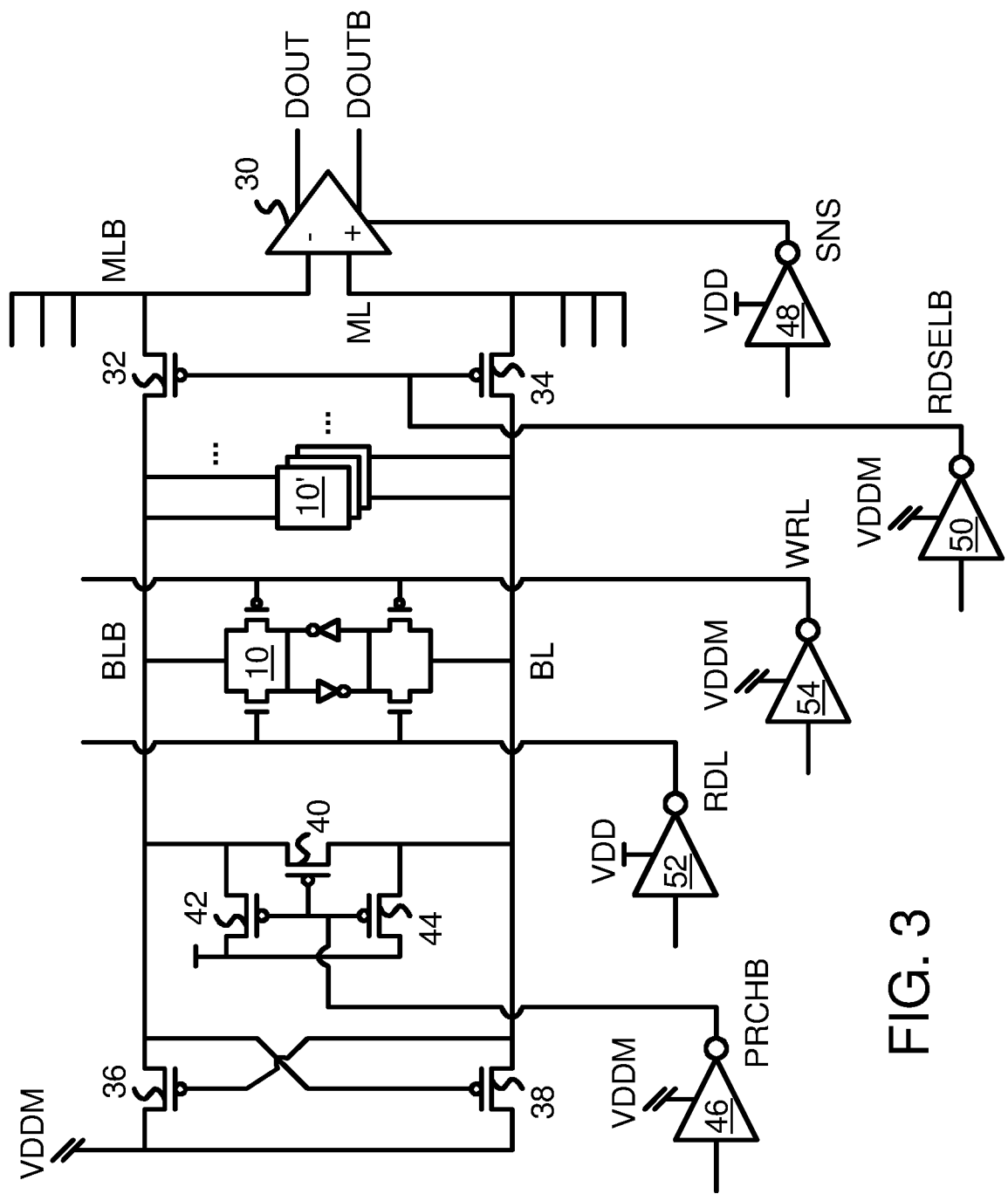
FIG. 3 is a schematic diagram of read interface circuitry to the 8T SRAM cell.

FIG. 3 is a schematic diagram of read interface circuitry to the 8T SRAM cell. SRAM cell 10 is arrayed into many rows and columns of cells 10'. Each row has two word lines, read word line RDL and write word line WRL. Each column has two bit lines BL, BLB, that carry true and complementary data. Word lines and bit lines to a single cell 10 are shown in this simplified diagram.

The power supply voltage VDD is boosted to memory supply voltage VDDM by a charge pump. VDDM can be one n-channel transistor threshold above VDD, such as VDD+125 mV. Memory cells 10, 10' are powered by VDDM.

Most read circuits are powered by VDD, such as buffer 52 that drives one selected read word line RDL high, sense amplifier 30, buffer 48 that activates sense amplifier 30 by driving sense signal SNS high, and the sources of pre-charge p-channel transistors 42, 44 that precharge the bit lines BL, BLB to VDD between read operations.

Most write circuits are powered by VDDM. Since the old data is held in cell 10 by VDDM, changing this data during a write operation would be difficult if writes were powered by a lower VDD. The write margin is improved by using VDDM rather than VDD for writes.

The write word line WRL is driven low by buffer 54 for the selected row, but is driven high for non-selected rows. To prevent leakage from these non-selected cells through p-channel pass transistors 12, 14, write word line WRL is driven high to VDDM rather than to VDD by buffer 54.

The bit lines BL, BLB are driven high to VDDM by cell 10. However, the read current from cell 10 may be small, causing a slow read. A bit-line latch is provided to assist the cell for both reads and writes. The sources of cross-coupled latch p-channel transistors 36, 38 are connected to VDDM, allowing the bit lines to be latched fully to VDDM and ground.

Although the sources of pre-charge p-channel transistors 42, 44 are connected to VDD, the gates are driven higher, to VDDM, by buffer 46, along with the gate of equalizing p-channel transistor 40. The higher VDDM on the gates of p-channel transistors 40, 42, 44 ensures that they are completely off when not precharging, even when the bit line is latched high to VDDM by the bit-line latch of transistors 36, 38.

During read operations, one column is selected and muxed onto mux lines ML, MLB to the inputs of sense amplifier 30, by muxing p-channel transistors 32, 34, which have gates driven low by read select signal RDSELB. Other non-selected columns are isolated from sense amplifier 30 by muxing p-channel transistors 32, 34 that have RDSELB driven high. Buffer 50 drives these non-selected RDSELB signals higher than VDD, to VDDM, to ensure that non-selected muxing p-channel transistors 32, 34 are turned completely off, even when their bit line is latched high to VDDM by cross-coupled latch p-channel transistors 36, 38.

The charge pump that generates VDDM does not have to provide a large current. The current draw from VDDM for SRAM cells 10, 10' is limited to only one row of selected cells. The current from VDDM for buffers 46, 54, 50 is limited to de-selecting just one row or column at a time. Thus a minimal current is drawn from VDDM.

Power-hungry circuits such as sense amplifiers 30 and pre-charge p-channel transistors 42, 44 draw current from VDD, not from VDDM. This reduces the current requirement and size of the charge pump that generates VDDM from VDD.

Since the bit lines are latched to VDDM by cross-coupled latch p-channel transistors 36, 38, any p-channel transistor that is connected to the bit lines could leak current if its gate was driven inactive by VDD. This current leakage is eliminated by driving to VDDM the gates of p-channel transistors that are connected to the bit lines. PRCHB, WRL, RDSELB are driven high to VDDM by buffers 46, 54, 50 to fully turn off equalizing p-channel transistor 40, pre-charge p-channel transistors 42, 44, p-channel pass transistors 12, 14 in cells 10, 10', and muxing p-channel transistors 32, 34.

Figure 4:
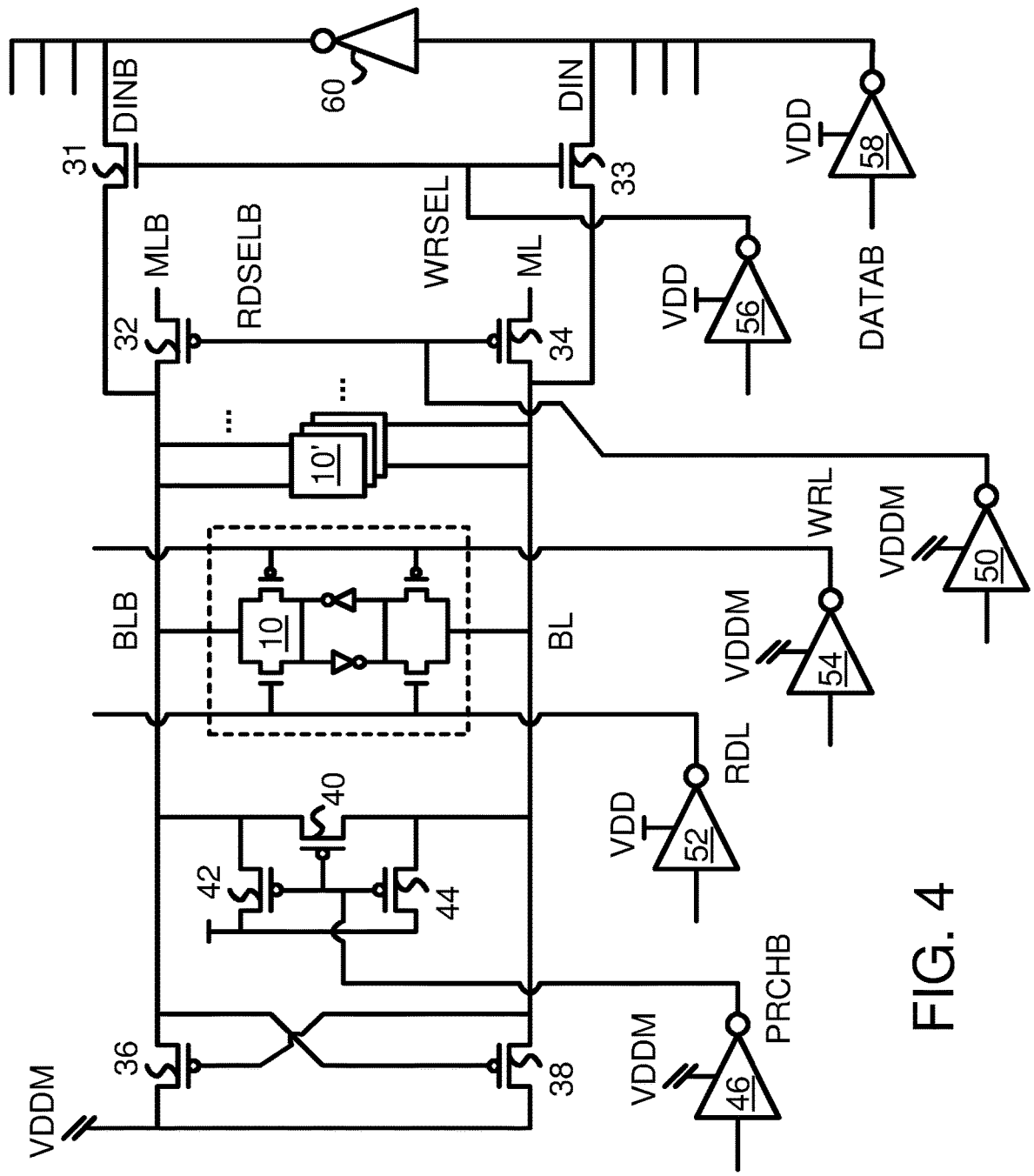
FIG. 4 is a schematic diagram of write interface circuitry to the 8T SRAM cell.

FIG. 4 is a schematic diagram of write interface circuitry to the 8T SRAM cell. Most components are as described before for the read interface circuitry of FIG. 3. During a write operation, both word lines are turned on for the selected row. Buffer 52 drives RDL high to VDD, and buffer 54 drives WRL low to ground to turn on all four pass transistors into selected cell 10. Having both p and n-channel pass transistors turned on in parallel reduces the effective resistance and increases the write current into the cell to flip the state of the latch being written.

Precharge control signal PRCHB is driven high to VDDM to fully turn off equalizing p-channel transistor 40 and pre-charge p-channel transistors 42, 44. Likewise, buffer 50 drives read select signal RDSELB high to VDDM to fully turn off muxing p-channel transistors 32, 34. Non-selected rows have buffer 52 driving RDL low and buffer 54 driving WRL high to VDDM to fully turn off pass transistors to non-selected cells 10'.

The inverse data bit (DATAB) to be written into cell 10 is inverted by buffer 58 to drive DIN high to VDD or low to ground. DIN is also inverted by inverter 60 to drive DINB low or high to VDD. The DIN, DINB lines are muxed onto bit lines BL, BLB of one of the columns by muxing n-channel transistors 31, 33. Buffer 56 drives write select signal WRSEL high to VDD for one of the columns and low for all other columns.

One of the bit lines BL, BLB remains pre-charged high to VDD through muxing n-channel transistors 31, 33, while the other bit line is driven low. The reduced high level on the bit line is boosted higher to VDDM by the latch of cross-coupled latch p-channel transistors 36, 38 during the write operation. This voltage boost from the pull-up latch to VDDM improves write margin due to the higher voltage on the bit line during write. The write speed can also be improved by the pull-up latch.

While buffer 58 and inverter 60 could be powered by VDDM to drive a higher high voltage onto the bit lines, this is not necessary due to the boost from the pull-up latch of cross-coupled latch p-channel transistors 36, 38. Using VDD rather than VDDM to power buffers 58 and inverters 60 significantly reduces the current load on the charge pump that generates VDDM.

Likewise, buffer 56 could be powered by VDDM rather than by VDD, allowing for a higher gate voltage onto muxing n-channel transistors 31, 33. This higher gate voltage would increase the high voltage driven onto the bit lines during a write. But the higher gate voltage on muxing n-channel transistors 31, 33 is not needed since the pull-up latch of cross-coupled latch p-channel transistors 36, 38 can provide a sufficient voltage boost to the bit lines during writes. So less power needs to be drawn from VDDM.

Figure 5:
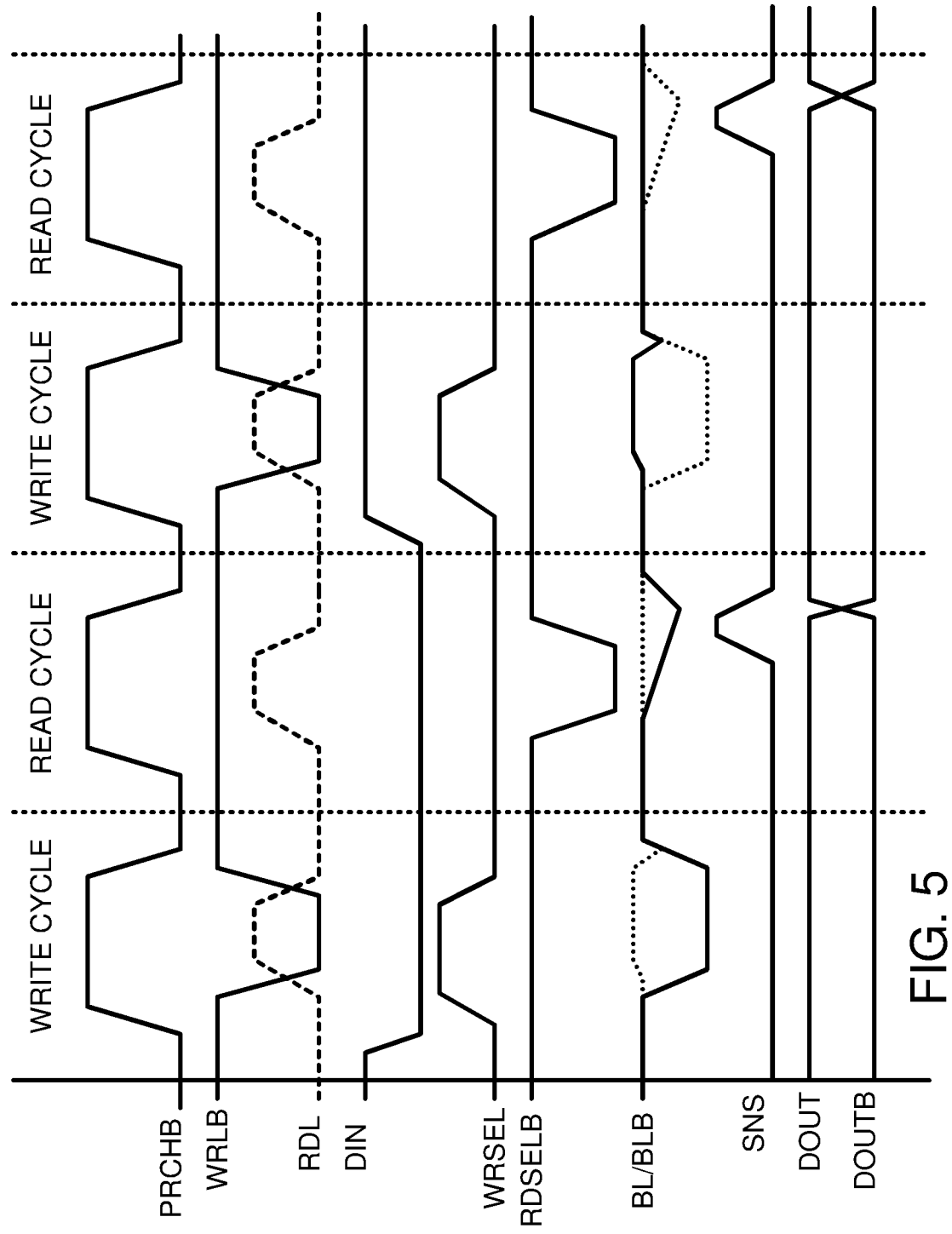
FIG. 5 is a waveform diagram of reading and writing the 8T SRAM cell.

FIG. 5 is a waveform diagram of reading and writing the 8T SRAM cell. Precharge signal PRECHB is active low between read or write cycles, equalizing each pair of bit lines BL, BLB through equalizing p-channel transistor 40, and precharging the bit lines high to VDD through precharge p-channel transistors 42, 44.

During a write cycle, both word lines are activated. WRL goes low to turn on p-channel pass transistors 12, 14, while RDL goes high to turn on n-channel pass transistors 16, 18 in the selected cell. The write select signal WRSEL goes high for one selected column but remains low for other non-selected columns. This allows the external data being written as DIN to be muxed onto bit lines BL, BLB which have both been precharged high to VDD. The low-going bit line is quickly driven low to ground, but the high-going bit line remains at VDD and is slowly driven higher to VDDM by the pull-up latch of cross-coupled latch p-channel transistors 36, 38.

During a read cycle, only the read word line RDL is activated. The write word line WRL remains inactive (high). With p-channel pass transistors 12, 14 off, only n-channel pass transistors 16, 18 conduct current from the cell latch to bit lines BL, BLB. Read margin and cell stability are improved since a higher effective resistance is provided with the p-channel pass transistors turned off and only the n-channel pass transistors conducting from the precharged bit lines to the cell latch. In addition, the cell provides a stronger "0" level using VDDM in the compliment node in the cell.

Depending on the data stored in the latch within cell 10, one of the bit lines BL is driven lower by the latch through the n-channel pass transistor, while the other bit line BLB remains high. The cell produces a relatively small current, so the bit line BL slowly swings lower in voltage.

The read select signal RDSELB is activated low for the selected column, while RDSELB remains high and inactive for other non-selected columns. RDSELB turns on muxing p-channel transistors 32, 34 to connect the bit lines to the differential inputs of the sense amplifier. The sense signal SNS is activated to cause the sense amplifier to amplify the voltage difference between the two bit lines to generate the data outputs DOUT, DOUTB. The timing of sense signal SNS can be set so that the cell has enough time to move one of the bit lines low enough that the sense amplifier can sense the voltage difference. If the sense amplifier were left on all the time, the wrong data could initially be read when the bit-line voltage difference is too small to be accurately sensed. Sensing the wrong initial data could trip the sense amplifier into an incorrect state that requires even more time to recover from. Thus having a timed sense signal SNS to enable sensing can improve the read access time.

Figure 6:
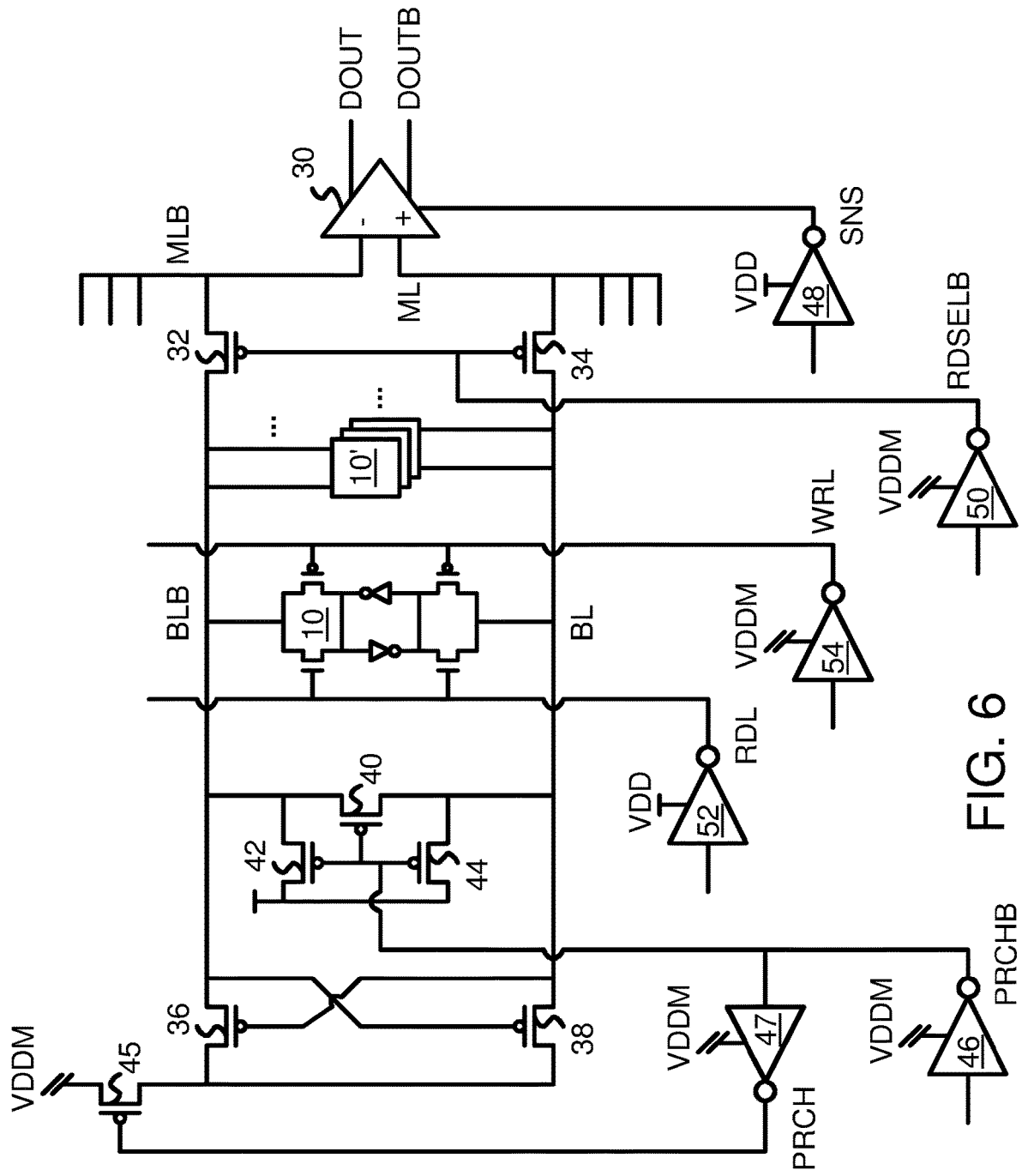
FIG. 6 shows a modified pull-up latch for the interface circuitry to the 8T SRAM cell.

FIG. 6 shows a modified pull-up latch for the interface circuitry to the 8T SRAM cell. Some devices may have a higher threshold or otherwise be more prone to leakage. For example, cross-coupled latch p-channel transistors 36, 38 may have a higher threshold than the voltage differential between VDDM and VDD. This higher threshold may still result in more sub-threshold leakage between VDDM and VDD than desired. Leakage-blocking p-channel transistor 45 has its gate driven by PRCH to control current from VDDM to the sources of cross-coupled latch p-channel transistors 36, 38. Leakage-blocking p-channel transistor 45 can cut off this leakage current from VDDM since it is driven high to VDDM by inverter 47. Leakage-blocking p-channel transistor 45 causes cross-coupled latch p-channel transistors 36, 38 to only turn on when the bit lines are not selected for precharge. Rather than PRCH, another signal with a different timing may be used, or the control signal can simply be RDSELB or an inverted WRSEL.

ALTERNATE EMBODIMENTS

Several other embodiments are contemplated by the inventors. For example VDDM is described as being applied to p-channel transistors that connect to the bit lines so that these p-channel transistors completely turn off and do not leak when de-selected. However, leakage may only occur at very high temperatures, such as above +125 C. When such high temperatures are not specified, such leakage may not occur, and using VDDM might not be necessary. VDDM could be provided to only some of buffers 46, 54, 50 or not to any of them.

While an 8T SRAM cell with pull-up p-channel transistors 20, 22 in the cell latch have been described, pull-up resistors could replace p-channel transistors 20, 22. Various layouts of the SRAM cell are possible.

While operation of the 8T SRAM cell has been described, various modifications can be made. For example, reading by using n-channel pass transistors 16, 18 and writing using all four pass transistors 12, 14, 16, 18 has been described, writing could be performed using only p-channel pass transistors 12, 14 without turning on RDL and n-channel pass transistors 16, 18. Another alternative is to read using p-channel pass transistors 12, 14 rather than using n-channel pass transistors 16, 18. This might be useful in a future technology wherein the p-channel transistors had a higher carrier mobility than the n-channel transistors.

The sense amplifier could be inverted and sense high-going rather than low-going bit lines, and the bit-line latch could latch to ground rather than to VDDM. A simplified sense amplifier such as a single-ended sense buffer could be substituted when there is a loose clock requirement or when using the latch to VDDM of cross-coupled latch p-channel transistors 36, 38, since the latch has enough time to pull the bit lines high and low so that differential sensing is not needed for the loose speed requirements. Using a simple single-ended sense amplifier can reduce costs for applications that do not have a strict timing requirement.

While a timed or clocked sense amplifier has been described with a sense signal SNS that disables the sense amplifier until a sufficient time has elapsed so that the selected SRAM cell has driven enough current to develop a voltage difference across the bit lines, a non-timed or asynchronous sense amplifier could be substituted, especially when a rapid read access time is not needed, or when the SRAM is not used in a synchronous environment. The sense signal SNS could be generated from a clock, a delay line, a dummy cell and dummy bit lines to approximate the delay in the array, or by some other means.

While simple inverting buffers have been shown in FIGS. 3, 4, these inverting buffers can be the last stage of more complex row decoders and column decoders or other logic. Address inputs, timing signal inputs and other inputs such as for power down or de-selection could be combined by logic within the decoders and other logic upstream to the final inverting buffers shown in FIGS. 3-4.

A controller could generate various timing signals from a clock or an access request signal to obtain the waveforms of FIG. 5. The simple inverting buffers 46, 48, 50, 52, 54, 56, 58 may be considered to be simplifications of more complex decoders and gating logic in a real memory device. Some memory architectures may not use row and column decoders of an address, such as a first-in-first-out (FIFO) that has an array of the 8T SRAM cell but uses shift registers with one high bit and the other bits low in place of the row decoders or column decoders.

Muxing by muxing p-channel transistors 32, 34 to sense amplifiers 30 could be 4:1, where four columns are muxed to one sense amplifier. Other muxing values are possible, such as 2:1, 8:1, etc. Various architectures can be employed, such as a standard array of rows and columns, a folded bit line architecture, sub-array architectures, split rows or split columns, dummy rows or dummy columns, etc. Columns or rows may be split or fold over such as where two physical columns have their bit lines connected together as a single column from a schematic viewpoint.

Various signals could be inverted. For example, the bit lines could be reset low rather than precharged high. The pre-initialized bit lines could be driven high by the selected cell rather than driven low. P-channel and n-channel transistors could be swapped. Inversions could be added or removed at various places, such as by swapping or crossing true and complement bit lines and mux lines, or adding or removing inverters or using non-inverting rather than inverting buffers.

The ground connection to the memory cells could connect to a back-bias generator that generates a body or bias voltage that is below ground. Level-shifters could be added and more complex power and ground supply schemes could be used. Power-down and disabling gates or devices could be added. The muxing of columns may be much more complex, and there may be sub-arrays and selections of one sub-array and disabling of other sub-arrays. Masking logic may be added that could disable sensing or writing of certain bits within a multi-bit word.

Applying VDDM to the cell provides a more robust storage of data in the cell. Read disturb is greatly reduced. Power-supply voltages as low as 0.4 volt can be permitted without data loss.

The actual margin values, and the power supply and VDDM voltages can vary. Supply voltages can be scaled with process improvements and may be dynamically adjusted or switched in a system, such as to reduce overheating when a temperature alarm is signaled, or when the system enters a low-power mode. A voltage regulator or filter might be added to VDDM, or the natural capacitances of the memory cells may be sufficient to regulate VDDM.

In one example, the 8T SRAM cell can be part of a SRAM that operates at 3 GHz with a nominal power supply voltage of 0.75 volt. Power consumption can be scaled by a factor of 10 by dropping the power-supply voltage down to 0.4 volt, and throttling the clock frequency down to 1 GHz.

The cross-coupled inverters in the 8T cell have been described as having a n-channel pull-down and a p-channel pull-up. However, it is well-known to use a high-resistance device such as a polysilicon load resistor for the pull-up instead of the p-channel transistor. Many layouts of the cell are possible within the spirit of the invention, and those skilled in the art will be able to make many modifications.

The n-channel access transistor has been described as having a source diffusion connected to the bit line and a drain diffusion connected to the cross-coupled inverters. However, those skilled in the art will recognize that MOS transistors are bi-directional in nature and the source and drain diffusions are physically indistinguishable. For normal bit-line biasing, the source terminal of an n-channel transistor has a lower voltage or potential than the drain terminal, but if the applied voltage is reversed then the source and drain terminals can reverse with the drain becoming the source and vice-versa. Thus the terms "source" and "drain" are used interchangeably, and for both p-channel and n-channel transistors.

Additional leaker devices such as resistors and small transistors could be added. Parasitic capacitances and resistances may be used from some components, depending on the process and device sizes used. Bias, VDD, and voltage values may vary somewhat due to process, temperature, and design variances.

While descriptions of current flows and operations have been presented, these are theoretical and the theories may be incomplete or even incorrect. Especially for small devices, currents may flow in unusual ways and using mechanisms that have not yet been thoroughly researched and understood. Second and third order effects may also be present.

Cutouts in diffusion and other regions may be used. Other shapes and physical layouts may be substituted, such as intermingled fingers. For FinFET transistors, fins could intersect other fins, bend, or have various macro geometries and layouts.

Devices may be implemented using n-channel, p-channel, or bipolar transistors, or junctions within these transistors, or carbon nanotubes. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths and spacings can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. More than one power supply may be used.

The background of the invention section may contain background information about the problem or environment of the invention rather than describe prior art by others. Thus, inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means".

The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A static Random-Access Memory (SRAM) cell comprising:
   a first pull-up transistor and a first pull-down transistor connected in series between a memory power supply and a ground, the first pull-up transistor and the first pull-down transistor connected at a first drain node;
   a second pull-up transistor and a second pull-down transistor connected in series between the memory power supply and the ground, the second pull-up transistor and the second pull-down transistor connected at a second drain node;
   wherein gates of the first pull-up transistor and of the first pull-down transistor are driven by the second drain node between the second pull-up transistor and the second pull-down transistor;
   wherein gates of the second pull-up transistor and of the second pull-down transistor are driven by the first drain node between the first pull-up transistor and the first pull-down transistor;
   a first n-channel pass transistor connected between the first drain node and a first bit line, and having a gate connected to a read word line;
   a second n-channel pass transistor connected between the second drain node and a second bit line, and having a gate connected to the read word line;
   a first p-channel pass transistor connected between the first drain node and the first bit line, and having a gate connected to a write word line; and
   a second p-channel pass transistor connected between the second drain node and the second bit line, and having a gate connected to the write word line;
   wherein the SRAM cell is arrayed in a memory having rows and columns in a memory device that further comprises for each row:
   a read row driver that drives a high voltage onto the read word line for a selected row, and drives a ground voltage onto the read word line for de-selected rows;
   a write row driver that drives the ground voltage onto the write word line for the selected row, and drives a high voltage onto the write word line for de-selected rows.

2. The SRAM cell of claim 1 wherein the read row driver drives the high voltage onto the read word line for both read operations and for write operations;
   wherein the write row driver drives the ground voltage onto the write word line only for write operations and not for read operations;
   wherein the write row driver drives the high voltage onto the write word line for all rows during a read operation;
   wherein both read and write word lines are activated for write operations, but only the read word line is activated for read operations.

3. The SRAM cell of claim 2 wherein the first pull-up transistor and the second pull-up transistor are p-channel transistors;
   wherein the first pull-down transistor and the second pull-down transistor are n-channel transistors.

4. The SRAM cell of claim 3 further comprising:
   a boosted supply voltage that is boosted above a power supply voltage;
   wherein the first pull-up transistor and the second pull-up transistor have sources connected to the boosted supply voltage;
   wherein the read row driver is powered by the power supply voltage;
   wherein the write row driver is powered by the boosted supply voltage;
   wherein the write word line is driven high to the boosted supply voltage, but the read word line is driven high to the power supply voltage.

5. A memory comprising:
   an array of memory cells arrayed into rows and into columns, wherein each memory cell comprises:
   a first inverter driving a first node;
   a second inverter driving a second node;
   wherein the first node drives an input to the second inverter;
   wherein the second node drives an input to the first inverter;
   a first n-channel pass transistor connecting the first node to a true bit line in response to a gate connected to a read word line;
   a second n-channel pass transistor connecting the second node to a complement bit line in response to a gate connected to the read word line;
   a first p-channel pass transistor connecting the first node to the true bit line in response to a gate connected to a write word line; and
   a second p-channel pass transistor connecting the second node to the complement bit line in response to a gate connected to the write word line;
   wherein each row of the array of memory cells comprises memory cells that are connected to the read word line and to the write word line for the row, wherein the read word line and the write word line are shared by memory cells in the row;
   wherein each column of the array of memory cells comprises memory cells that are connected to the true bit line and to the complement bit line for the column;
   wherein the true bit line and the complement bit line are shared by memory cells in the column;
   wherein each row further comprises:
   a read row driver that drives the read word line high when the row is selected for reading, and that drives the read word line low when the row is deselected for reading;
   a write row driver that drives the write word line low when the row is selected for writing, and that drives the write word line high when the row is deselected for writing.

6. A memory comprising:
an array of memory cells arrayed into rows and into columns, wherein each memory cell comprises:
a first inverter driving a first node;
a second inverter driving a second node;
wherein the first node drives an input to the second inverter;
wherein the second node drives an input to the first inverter;
a first n-channel pass transistor connecting the first node to a true bit line in response to a gate connected to a read word line;
a second n-channel pas transistor connecting the second node to a complement bit line in response to a gate connected to the read word line;
a first p-channel pass transistor connecting the first node to the true bit line in response to a gate connected to a write word line; and
a second p-channel pass transistor connecting the second node to the complement bit line in response to a gate connected to the write word line;
wherein each row of the array of memory cells comprises memory cells that are connected to the read word line and to the write word line for the row, wherein the read word line and the write word line are shared by memory cells in the row;
wherein each column of the array of memory cells comprises memory cells that are connected to the true bit line and to the complement bit line for the column;
wherein the true bit line and the complement bit line are shared by memory cells in the column;
wherein the read row driver further drives the read word line high when the row is selected for writing, and that drives the read word line low when the row is deselected for reading or writing,
wherein the read word line is activated for both reading and for writing.

7. The memory of claim 6 further comprising:
a memory supply node for carrying a memory supply voltage that is generated from a power supply voltage by a voltage booster, wherein the memory supply voltage is boosted above the power supply voltage by the voltage booster;
wherein the first inverter and the second inverter in the memory cell are powered by the memory supply node,
whereby memory cells are powered by a boosted supply voltage.

8. The memory of claim 7 wherein the write row driver is powered by the memory supply node, wherein the write word line is driven high to the memory supply voltage to isolate the memory cells in the row when the row is deselected for writing.

9. The memory of claim 8 wherein each column further comprises:
an equalizing p-channel transistor that conducts between the true bit line and the complement bit line in response to a gate receiving a precharge signal;
a first pre-charge p-channel transistor having a source connected to the power supply voltage and a drain connected to the true bit line and a gate receiving the precharge signal;
a second pre-charge p-channel transistor having a source connected to the power supply voltage and a drain connected to the complement bit line and a gate receiving the precharge signal.

10. The memory of claim 9 wherein each column further comprises:
a first latch p-channel transistor having a source connected to the memory supply node and a drain connected to the true bit line and a gate connected to the complement bit line;
a second latch p-channel transistor having a source connected to the memory supply node and a drain connected to the complement bit line and a gate connected to the true bit line,
whereby the true bit line and the complement bit line are latched to the memory supply voltage.

11. The memory of claim 10 further comprising:
a precharge driver that drives the precharge signal low to precharge and equalize bit lines before reading or writing, and that drives the precharge signal high when reading or writing.

12. The memory of claim 11 wherein each column further comprises:
a first muxing p-channel transistor that connects the true bit line to a true muxing line in response to a gate that receives a read select signal;
a second muxing p-channel transistor that connects the complement bit line to a complement muxing line in response to a gate that receives the read select signal;
wherein the true muxing line and the complement muxing line are input to a sense amplifier that generates read data that is read from the memory cell; and
a read select driver that drives the read select signal low when the column is selected for reading, and that drives the read select signal high when the column is not selected for reading.

13. The memory of claim 12 wherein the read select driver is powered by the memory supply node, wherein the read select signal is driven high to the memory supply voltage to isolate the bit lines when not being read;
wherein the precharge driver is powered by the memory supply node, wherein the precharge signal is driven high to the memory supply voltage to isolate the bit lines when reading or writing.

14. The memory of claim 13 further comprising:
a first muxing n-channel transistor that connects the true bit line to a true data mux line in response to a gate that receives a write select signal;
a second muxing n-channel transistor that connects the complement bit line to a complement data mux line in response to a gate that receives the write select signal;
wherein the true data mux line and the complement data mux line carry complementary data being written into the memory cell during a write operation; and
a write select driver that drives the write select signal high when the column is selected for writing, and that drives the write select signal low when the column is not selected for writing.

15. The memory of claim 14 wherein the first inverter comprises:
a first p-channel transistor having a source connected to the memory supply node and a drain connected to the first node and a gate connected to the second node;
a first n-channel transistor having a source connected to a ground and a drain connected to the first node and a gate connected to the second node;
wherein the second inverter comprises:
a third p-channel transistor having a source connected to the memory supply node and a drain connected to the second node and a gate connected to the first node;
a fourth n-channel transistor having a source connected to a ground and a drain connected to the second node and a gate connected to the first node.

16. An 8T-cell memory comprising:
an array of memory cells, each memory cell comprising:
- a first pull-up p-channel transistor having a source connected to a memory voltage supply, a drain connected to a first node, and a gate connected to a second node;
- a first pull-down n-channel transistor having a source connected to a ground voltage supply, a drain connected to the first node, and a gate connected to the second node;
- a second pull-up p-channel transistor having a source connected to the memory voltage supply, a drain connected to the second node, and a gate connected to the first node;
- a second pull-down n-channel transistor having a source connected to the ground voltage supply, a drain connected to the second node, and a gate connected to the first node;
- a first n-channel pass transistors having a gate connected to a read word line, and a channel connected between the first node and a first bit line;
- a second n-channel pass transistors having a gate connected to the read word line, and a channel connected between the second node and a second bit line;
- a first p-channel pass transistors having a gate connected to a write word line, and a channel connected between the first node and the first bit line; and
- a second p-channel pass transistors having a gate connected to the write word line, and a channel connected between the second node and the second bit line;

wherein each row in the array of memory cells has a read word line and a write word line that connect to memory cells in the row;

wherein each column in the array of memory cells has a first bit line and a second bit line that connect to memory cells in the column;

wherein the memory voltage supply is higher in voltage than a power supply voltage by 50 to 150 mV;

wherein each row further comprises:
- a read word line driver that drives the power supply voltage onto the read word line when the row is selected and being read or written, and that connects the ground voltage supply to the read word line when the row is not selected and being read or written;
- a write word line driver that connects the ground voltage supply to the write word line when the row is selected and being written, and that connects the power supply voltage to the write word line when the row is not selected and being written;

wherein each column further comprises:
- a first cross-coupled latch p-channel transistor having a source connected to a source node, and a drain connected to the first bit line, and a gate connected to the second bit line; and
- a second cross-coupled latch p-channel transistor having a source connected to the source node, and a drain connected to the second bit line, and a gate connected to the first bit line;
- a leakage-blocking p-channel transistor, having a gate receiving a control signal, coupled to conduct current from the memory supply voltage to the source node;

whereby 8-Transistor memory cells have two word lines but one pair of bit lines.

17. The 8T-cell memory of claim 16 wherein each column further comprises:
- an equalizing p-channel transistor that conducts between the first bit line and the second bit line in response to a gate receiving a precharge signal;
- a first pre-charge p-channel transistor having a source connected to the power supply voltage and a drain connected to the first bit line and a gate receiving the precharge signal;
- a second pre-charge p-channel transistor having a source connected to the power supply voltage and a drain connected to the second bit line and a gate receiving the precharge signal; and
- a precharge driver that drives the precharge signal low to precharge and equalize bit lines before reading or writing, and that drives the precharge signal high to the memory voltage supply when reading or writing.

* * * * *